(12) United States Patent
Lee et al.

(10) Patent No.: US 8,119,309 B2
(45) Date of Patent: Feb. 21, 2012

(54) REFLECTIVE PHOTOMASK AND METHOD OF FABRICATING, REFLECTIVE ILLUMINATION SYSTEM AND METHOD OF PROCESS USING THE SAME

(75) Inventors: Dong-Gun Lee, Hwaseong-si (KR);
Seong-Sue Kim, Seoul (KR);
Hwan-Seok Seo, Suwon-si (KR);
In-Sung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 191 days.

(21) Appl. No.: 12/656,668

(22) Filed: Feb. 12, 2010

(65) Prior Publication Data
US 2010/0216062 A1 Aug. 26, 2010

(30) Foreign Application Priority Data
Feb. 9, 2009 (KR) .................. 10-2009-0010344

(51) Int. Cl.
*G03F 1/00* (2006.01)
*G03F 9/00* (2006.01)

(52) U.S. Cl. .......................................... 430/5; 430/394
(58) Field of Classification Search ............. 430/5, 322, 430/323, 324, 394; 378/35
See application file for complete search history.

(56) References Cited

U.S. PATENT DOCUMENTS

| 5,328,784 | A | 7/1994 | Fukuda |
| 7,282,305 | B2 * | 10/2007 | Shoki et al. ...................... 430/5 |
| 7,390,596 | B2 * | 6/2008 | Ishibashi et al. .................. 430/5 |

FOREIGN PATENT DOCUMENTS

| JP | 05-088355 A | 4/1993 |
| JP | 2004-289110 A | 10/2004 |
| KR | 10-0184278 B1 | 4/1999 |

* cited by examiner

*Primary Examiner* — Stephen Rosasco
(74) *Attorney, Agent, or Firm* — Lee & Morse, P.C.

(57) ABSTRACT

A reflective photomask includes a phase shift object on a substrate, a reflective layer stacked on the substrate and the phase shift object, a capping layer on the reflective layer, the capping layer including at least one surface portion having a bent shape, and a light absorption pattern on the capping layer, the light absorption pattern including at least one slit exposing the surface portion of the capping layer having the bent shape.

19 Claims, 7 Drawing Sheets

REFLECTIVE PHOTOMASK AND METHOD OF FABRICATING, REFLECTIVE ILLUMINATION SYSTEM AND METHOD OF PROCESS USING THE SAME

BACKGROUND

1. Field

Example embodiments relate to photolithography using extreme ultraviolet (EUV) light for semiconductor fabrication. In particular, example embodiments relate to a reflective photomask for monitoring a pattern shift caused by a change in position of the focus of light, methods of fabricating the reflective photomask, a reflective illumination system using the reflective photomask, and a method of using the reflective photomask.

2. Description of the Related Art

In a photolithography technique for semiconductor fabrication the focus of light should be optimally located on a wafer. Therefore, the procedures of measuring a depth of focus (DOF) for forming an image according to a position shift of the focus of light, determining an optimum position of the focus, and controlling a photolithography process based on the optimum position of the focus may significantly improve productivity of semiconductor fabrication technology.

For example, the focus of light may change by replacing any part of an illumination system of the photolithography equipment, thereby requiring frequent monitoring of the change in position of the focus of light. However, a conventional device and method for monitoring a change in position of the focus of light, e.g., a pattern used for monitoring a change in position of the focus of light in a transparent illumination system, cannot be used in a reflective illumination system that uses EUV light.

SUMMARY

Embodiments are therefore directed to a reflective photomask, a reflective illumination system using the reflective photomask, and associated methods, which substantially overcome one or more of the problems due to the limitations and disadvantages of the related art.

It is therefore a feature of an embodiment to provide a reflective photomask structure capable of accurately monitoring a pattern shift caused by a change in position of the focus of light.

It is another feature of an embodiment to provide a method of fabricating a reflective photomask structure capable of accurately monitoring a pattern shift caused by a change in position of the focus of light.

It is yet another feature of an embodiment to provide a reflective illumination system using EUV light and a reflective photomask structure capable of accurately monitoring a pattern shift caused by a change in position of the focus of light.

It is still another feature of an embodiment to provide a process of using a reflective photomask structure capable of accurately monitoring a pattern shift caused by a change in position of the focus of light.

At least one of the above and other features and advantages may be realized by providing a reflective photomask, including a phase shift object formed on a substrate, a reflective layer stacked on the substrate and the phase shift object, a capping layer on the reflective layer, and a light absorption pattern including at least one slit formed on the capping layer, wherein the slit exposes at least one surface portion of the capping layer, and the surface portion of the capping layer has a bending shape.

The substrate may include glass or silica doped with titanium. The phase shift object may have a shape of a bar or a rectangle in plan view and a shape of a rectangle in vertical cross-sectional view. The phase shift object may have a thickness of ½ of a wavelength of light incident on the reflective photomask or less. The reflective layer may include a stack of forty pairs of a first reflective layer and a second reflective layer, and the phase shift object may include chromium, the first reflective layer is a molybdenum layer, the second reflective layer is a silicon layer, and the capping layer is a silicon oxide layer. The light absorption pattern may include a lower light absorption pattern and an upper light absorption pattern, the lower light absorption pattern including a refractory metal, and the upper light absorption pattern including chromium or tantalum nitride. A bottom of the slit may overlap an edge of the phase shift object. A bottom of the slit may face an interior of the slit and may be defined by an upper surface of the capping layer, the bottom of the slit being non-flat. The bent shape of the capping layer may include two portions arranged at an oblique angle, the slit exposing the oblique angle.

At least one of the above and other features and advantages may also be realized by providing a reflective photomask, including a mesa shaped phase shift object on a substrate, a reflective layer on the substrate having the phase shift object, the reflective layer having at least one bending portion along the mesa shape of the phase shift object, a capping layer on the reflective layer, the capping layer having at least one bending portion along the bending portion of the reflective layer, and a light absorption pattern including at least one slit on the capping layer, wherein the slit exposes at least one surface of the bending portion of the capping layer.

At least one of the above and other features and advantages may also be realized by providing a reflective illumination system, including a light source generating EUV light, a mirror reflecting the light, a reflective photomask reflecting the reflected light from the mirror, a target plan forming a pattern image from the reflected light from the reflective photomask, wherein the reflective photomask includes a phase shift object formed on a substrate, a reflective layer stacked on the substrate and the phase shift object, a capping layer on the reflective layer, and a light absorption pattern including at least one slit formed on the capping layer, wherein the slit exposes at least one surface portion of the capping layer, the surface portion of the capping layer has a bending shape.

At least one of the above and other features and advantages may also be realized by providing a method of fabricating a reflective photomask, including forming a phase shift object on a substrate, forming a reflective layer on the substrate and the phase shift object, forming a capping layer on the reflective layer, and forming a light absorption pattern including at least one slit on the capping layer, wherein the slit exposes at least one surface portion of the capping layer, the surface portion of the capping layer has a bending shape.

Forming the phase shift object may include forming a phase shift layer with a thickness of about 6.75 nm on the substrate and patterning the phase shift layer to form the phase shift object. Patterning the phase shift layer may include using an electron beam lithography technique. Forming the reflective layer may include stacking forty unit reflective layers, one unit reflective layer including a first reflective layer formed of molybdenum and a second reflective layer formed of silicon. Forming the light absorption pattern may include forming a light absorption layer to cover the entire capping layer, and patterning the light absorption layer in regions overlapping the bent shape of the capping layer to form at least one slit.

A method of performing a reflective illuminating process may include generating light from a light source, directing the light from the light source to be incident on a mirror, such that the light is reflected from the mirror to be incident on the reflective photomask, and directing the light from the reflective photomask to be incident on a target to form a pattern image. The method may further include repeatedly illuminating the reflected light from the reflected photomask on the target plan to form pattern images, the reflected light having shifted focus portions. The method may further include inspecting the pattern image using an optical microscope or an electron microscope. The target may be an inspection plan of pattern inspection apparatus.

At least one of the above and other features and advantages may also be realized by providing a method of performing a reflective illuminating process, including generating a light from a light source, illuminating the light to on a mirror and reflecting the light from the mirror, illuminating the reflected light from the mirror on a reflective photomask and reflecting the light from the reflective photomask, and illuminating the reflected light from the reflected photomask on a target plan to form a pattern image, wherein the reflective photomask comprises a phase shift object formed on a substrate, a reflective layer stacked on the substrate and the phase shift object, a capping layer on the reflective layer, and a light absorption pattern including at least one slit formed on the capping layer, wherein the slit exposes at least one surface portion of the capping layer, the surface portion of the capping layer has a bending shape.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
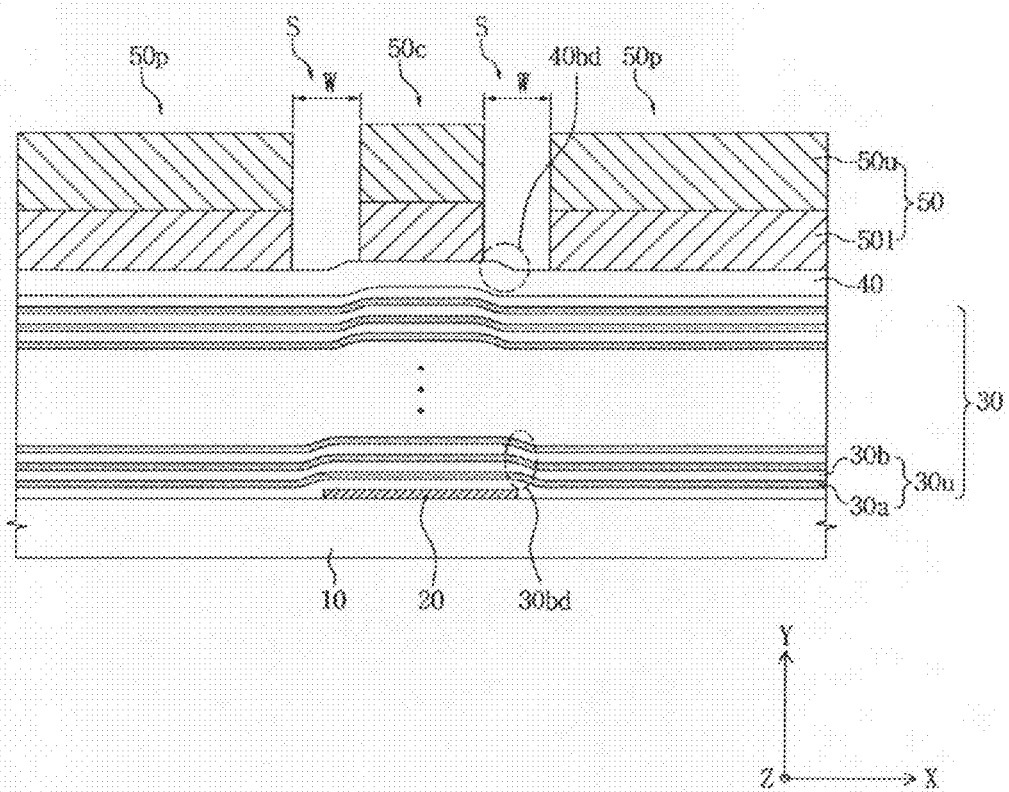
FIG. 1 illustrates a conceptual cross-sectional view of a reflective photomask according to example embodiments.

Korean Patent Application No. 10-2009-0010344, filed on Feb. 9, 2009, in the Korean Intellectual Property Office, and entitled: "Reflective Photomask and Method of Fabricating, Reflective Illumination System and Method of Process Using the Same," is incorporated by reference herein in its entirety.

Various example embodiments will now be described more fully with reference to the accompanying drawings in which some example embodiments are shown. In the drawings, dimensions of layers and regions may be exaggerated for clarity.

Detailed illustrative embodiments are disclosed herein. However, specific structural and functional details disclosed herein are merely representative for purposes of describing example embodiments. Embodiments, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like reference numerals refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A change of the focus of light may affect only a size or fidelity of a pattern in a transparent photolithography system. The change of the focus of light may further affect a position shift of a pattern in a reflective photolithography system, e.g., because light is incident on a mirror system or a wafer at a fine angle. Therefore, a reflective photomask according to example embodiments may include a structure for accurately monitoring a position shift of a pattern caused by a change of the focus of light in the reflective photolithography system.

FIG. 1 illustrates a conceptual cross-sectional view of a reflective photomask according to example embodiments. Referring to FIG. 1, the reflective photomask may include a substrate 10, a phase shift object 20, a reflective layer 30, and a light absorption pattern 50 with at least one slit S exposing a smooth bend in an underlying layer of the light absorption pattern 50. A capping layer 40 may be further provided between the reflective layer 30 and the light absorption pattern 50. The light absorption pattern 50 may include an upper light absorption pattern 50u and a lower light absorption pattern 50l. Moreover, the light absorption pattern 50 may include a central light absorption pattern 50c aligned over the phase shift object 20 to overlap at least a portion of the phase shift object 20, and a peripheral light absorption pattern 50p peripheral to the phase shift object 20, i.e., not overlapping the phase shift object 20. The at least one slit S in the light absorption pattern 50 may be formed between the central light absorption pattern 50c and the peripheral light absorption pattern 50p. A top surface of the reflective layer 30 and/or the capping layer 40, i.e., the underlying layer of the light absorption pattern 50, may be exposed through the slit S and may have the smooth bend.

The substrate 10 may be formed of any suitable material, e.g., glass and/or an inorganic compound such as ceramic. For example, the substrate 10 may be formed of a low temperature expansion material (LTEM), e.g., silica doped with titanium. The substrate 10 may be formed in a shape of a rectangle with a predetermined thickness, e.g., the substrate 10 may have a thickness of about ¼ inches and a size of about 6 square inches.

The phase shift object 20 may be formed on, e.g., directly on, the substrate 10. The phase shift object 20 may have a quadrangular shape, e.g., a shape of a bar or a rectangle, when viewed in a plan view, e.g., xz-plane in FIG. 1. In addition, the phase shift object 20 may have a rectangular shape, e.g., a mesa shape, when viewed in a vertical cross-sectional view, e.g., xy-plane in FIG. 1. The phase shift object 20 may be formed of one or more materials used in reflective photomask fabrication technology, e.g., chromium, molybdenum, aluminum, and/or a compound or alloy thereof. For example, the phase shift object 20 may be formed of chromium. The phase shift object 20 may have a thickness, i.e., an optimal thickness, corresponding to about ¼ of a wavelength of light to be used in the photolithography equipment, i.e., $t_{optimal} = \lambda \times \frac{1}{4}$. For example, when a shift of the focus of light is measured in photolithography equipment using EUV light, an average wavelength of EUV light may be about 13.5 nm and the optimal thickness of the phase shift object 20 may range from about 3.37 nm to about 3.38 nm. It is noted, however, that while the optimal thickness $t_{optimal}$ of the phase shift object 20 may be about $\lambda \times \frac{1}{4}$, a theoretical thickness $t_{theoretical}$ of the phase shift object 20 capable of shifting the focus of light may be acquired by $t_{theoretical} = [(\lambda \times \frac{1}{4}) \pm (\lambda \times \frac{1}{4})]$. It is further noted that since the thickness cannot be zero (0), the thickness of the phase shift object 20 may be equal to about ½ of the wavelength of light or less, e.g., about ¼ of the wavelength of light. Since EUV light contains light of various wavelengths, it is preferable to thoroughly control a thickness change, e.g., a distance measured along the y-axis, of the phase shift object 20. A horizontal area occupied by the phase shift object 20, e.g., a length and/or a width of the phase shift object 20 along respective x and z axes, may vary according to a region for monitoring a focus shift or monitoring equipment thereof.

The reflective layer 30 may be on the substrate 10, and may cover, e.g., completely overlap, the phase shift object 20. The reflective layer 30 may have a multilayer structure. For example, a first reflective layer 30a, e.g., a molybdenum layer, and a second reflective layer 30b, e.g., a silicon layer, may be formed as a pair to constitute a unit reflective layer 30u of the reflective layer 30 on the substrate 10. For example, the reflective layer 30 may include about forty (40) unit reflective layers 30u, i.e., pairs of first and second reflective layers 30a and 30b, sequentially stacked on the substrate 10. A thickness of the unit reflective layer 30u may range from about 6.7 nm to about 6.8 nm, which is equivalent to about ½ of the wavelength of light used in the illumination system. For example, when light used in the illumination system according to example embodiments is EUV light, the thickness of the first-layer unit reflective layer 30u may range from about 6.7 nm to about 6.8 nm, e.g., the unit reflective layer 30u may be thicker than the phase shift object 20 by a factor of two. When the first reflective layer 30a is a molybdenum layer, the first reflective layer 30a may be formed of about 11 atomic layers. When the second reflective layer 30b is a silicon layer, the second reflective layer 30b may be formed of about 15 atomic layers. The molybdenum layer 30a containing about 11 atomic layers may have a thickness of about 2.65 nm to about 2.7 nm, and the silicon layer 30b containing about 15 atomic layers may have a thickness of about 4.0 nm to about 4.1 nm. The thickness of each of the first and second reflective layers 30a and 30b may vary according to energy. Such thicknesses are obtained in a stable energy state at a normal temperature.

In other example embodiments, the reflective layer 30 may be formed of three or more kinds of material layers, e.g., the unit reflective layer 30u may include a third reflective layer formed of a boron carbide ($B_4C$) layer between respective unit reflective layers 30u or between the first reflective layer 30a and the second reflective layer 30b. The boron carbide layer may not have a fixed thickness but a variable thickness, e.g., the boron carbide layer may have a thickness of about 0.25 nm or about 0.40 nm. For example, a boron carbide layer may be formed to a thickness of about 0.25 nm on the first reflective layer 30a, and the second reflective layer 30b, e.g., of a same unit reflective layer 30u as the first reflective layer 30a, may be formed subsequently on the boron carbide layer. In another example, a boron carbide layer may be formed to a thickness of about 0.40 nm on the second reflective layer 30b, and the first reflective layer 30a, e.g., of a different unit reflective layer 30u than the second reflective layer 30b, may be formed on the boron carbide layer. In either case, the first reflective layer 30a and/or the second reflective layer 30b may vary in thickness. For example, the first reflective layer 30a may be reduced in thickness to about 2.09 nm and/or the second reflective layer 30b may be increased in thickness to about 4.14 nm, i.e., the thickness may be increased or decreased.

In the reflective layer 30, a portion stacked on the phase shift object 20 and a portion stacked on the substrate 10 may have differences in bend and height following the shape of the phase shift object 20. In other words, since the phase shift object 20 extends on, e.g., directly on, the substrate 10 to a predetermined thickness along the y-axis, portions of the reflective layer 30 on, e.g., directly on, the phase shift object 20 and the substrate 10 may extend to different heights along the y-axis with respect to a same reference point on an upper surface of the substrate 10, i.e. a surface facing the reflective layer 30. For example, the reflective layer 30 may have a first portion directly on the substrate 10 and parallel thereto, and a second portion directly on the phase shift object 20 and parallel thereto, such that the first and second portions may be continuously connected to each other via a bend portion 30bd. The bend portion 30bd may overlap a sidewall of the phase shift object 20, and may have an inclined upper surface, i.e., a surface facing the light absorption pattern 50, with respect to the upper surface of the substrate 10. For example, the bend portion 30bd may define an oblique angle with each of the first and second portions.

Since the reflective layer 30 includes a plurality of stacked layers having respective first and second portions connected via the bend portions, the bend portions may gradually become smooth as the layers are stacked. In other words, in an uppermost layer of the reflective layer 30, i.e., a layer farthest from the substrate 10, height differences between respective first and second portions may be smaller than in the lowermost layer of the reflective layer 30, so an inclination angle of the bend portion 30bd therebetween may be smoother, e.g., smaller, and a length of the bend portion may be smaller, i.e., narrower along the x-axis. As illustrated in FIG. 1, the bend portion 30bd may be the widest directly on the phase shift object 20, and may gradually narrow as the layers are stacked.

The capping layer 40 may be further provided on, e.g., directly on, the reflective layer 30. The capping layer 40 may protect the reflective layer 30, e.g., from chemical and physical impacts. For example, while the light absorption pattern 50 may be formed, the capping layer 40 may protect the reflective layer 30 from chemical attacks. Even after the light absorption pattern 50 is formed, the capping layer 40 may protect the reflective layer 30. Moreover, the capping layer 40 may enhance adhesion between the reflective layer 30 and the light absorption patterns 50. The capping layer 40 may be formed of a material transparent to EUV light, e.g., silicon oxide ($SiO_2$), and may be formed to a predetermined thickness, e.g., about 10 nm to about 30 nm. Since the capping layer 40 is on the reflective layer 30, the capping layer may include at least one surface portion having a bent shape, i.e., a bend portion 40bd overlapping the bend portion 30bd of the reflective layer 30. The bend portion 40bd of the capping layer 40 may be exposed to the outside via the slit S of the light absorption layer 50, e.g., a bottom of the slit S may be non-flat, to shift the focus of light to spatially various positions when reflecting light, e.g., light incident on the bend portion 40bd through the slit S may reflect to multiple positions simultaneously. That is, it may be possible to shift the focus of light not to any one position but to several positions.

The light absorption pattern 50 may be formed on the reflective layer 40 in a single-layer or multilayer structure. That is, the light absorption pattern 50 may include the lower light absorption pattern 50l and the upper light absorption pattern 50u. The lower light absorption pattern 50l may be formed of a refractory metal, e.g., ruthenium, and the upper light absorption pattern 50u may be formed of chromium, e.g., an easily processed metal, and/or tantalum nitride, e.g., a thinner layer than chromium that may improve definition of the pattern. The light absorption pattern 50 may have a thickness of about 120 nm. The upper light absorption pattern 50u may be thicker than the lower light absorption pattern 50l. For example, the lower light absorption pattern 50l may be formed to a thickness of about 50 nm, and the upper light absorption pattern 50u may be formed to a thickness of about 70 nm. In modified example embodiments, a silicon oxynitride layer may be formed between the reflective layer 30 and the light absorption pattern 50 to a thickness of a few tens nm. Here, the light absorption pattern 50 may be formed in a single-layer structure.

The light absorption pattern 50 may include the central light absorption pattern 50c and the peripheral light absorption pattern 50p. The light absorption pattern 50 may include at least one slit S between the central light absorption pattern 50c and the peripheral light absorption pattern 50p, e.g., two slits S may be formed through an entire thickness of the light absorption patter 50 to completely separate the central absorption pattern 50c from two adjacent peripheral light absorption patterns 50p. The slit S may expose a portion of an upper surface of the capping layer 40, such that the bend portion 40bd of the capping layer 40 may be exposed. For example, the slit S may overlap the, e.g., entire, bend portion 40bd. For example, as illustrated in FIG. 1, a bottom of the slit S may be non flat, e.g., may include an elevated portion adjacent to the central light absorption pattern 50c. For example, the slit S may be vertically aligned with an end portion of the phase shift object 20, e.g., a bottom of the slit S may overlap an edge of the phase shift object 20 to have a center of the slit S and the edge of the phase shift object 20 aligned with each other vertically.

A width W of the slit S may vary depending upon definition of the equipment which monitors a change of the pattern caused by a shift of the focus of light. The width W of the slits S is relevant to a numerical aperture (NA) of the illumination system of the photolithography equipment and is also relevant to the critical dimension (CD) of the pattern to be formed. For example, when the pattern shift caused by the change of the focus of light is to be monitored in the illumination system having a large NA, the width W of the slit S may be decreased. In particular, since the shift of the focus becomes sensitive as the NA increases, it may be difficult to accurately measure the pattern shift caused by the change of the focus of light when the width W of the slit S is large. In addition, when the pattern having a small CD is to be formed, it may be easier to accurately monitor and measure the pattern shift when the width W of the slit S is decreased, e.g., because the pattern shift caused by the change of the focus of light should be thoroughly measured when the pattern is fine. When the width W of the slit S is too large with respect to the NA of the illumination system and the CD of the pattern, it may be difficult to precisely measure the pattern shift caused by the change of the focus of light. In contrast, when the width W of the slits S is too small, it may be difficult to check the overall change due to too precise measurement. That is, the NA and the width W of the slit S are inversely proportional to each other, and the CD and the width W of the slits S are directly proportional to each other. Therefore, an optimal width W of the slit S may be determined according to the NA of the illumination system of the photolithography equipment, the CD of the pattern to be formed, and so on.

The light absorption pattern 50 may include any suitable number of slits S, e.g., a sufficient number on one photomask for monitoring. That is, the optimal number of slit S may be formed in one photomask for monitoring according to the NAs of the illumination systems of almost all the photolithography equipment and the CDs of the patterns to be formed. However, it is to be noted that adjusting the width W of the slits S according to the NA or the CD of the pattern may provide a good environment for monitoring, but is not obligatory.

A width of the central light absorption pattern 50c may be adjusted to prevent both-side slits S from affecting each other, when the pattern shift caused by the change of the focus of light is monitored using the slits S. In example embodiments, the width of the central light absorption pattern 50c may be about 1 μm, so the two slits S, e.g., one slit S along each of two sides of the central light absorption pattern 50c in FIG. 1, may be prevented from affecting each other and from being influenced by various loading effects. The central light absorption pattern 50c may be aligned with, e.g., completely overlapping, the phase shift object 20. The width of the central light absorption pattern 50c may be smaller than that of the phase shift object 20.

FIGS. 2A to 2D illustrate conceptual plan-views of various configurations of slits S in a reflective photomask according to example embodiments. It is noted that the plan views of the slits in FIGS. 2A to 2D correspond to xz-pane of FIG. 1.

Figure 2A:
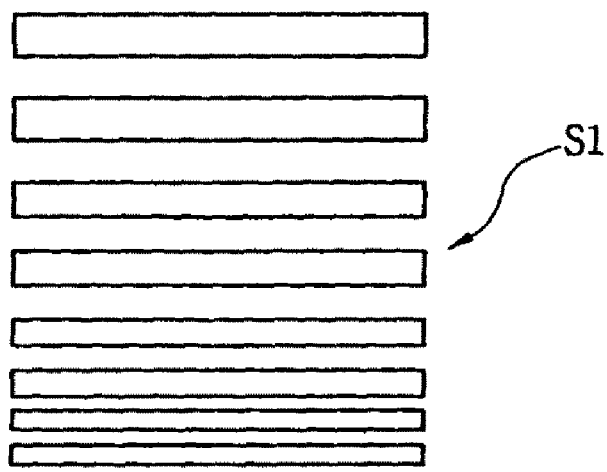
FIGS. 2A to 2D illustrate conceptual plan-views of various shapes of slits in a reflective photomask according to example embodiments.
Figure 2B:
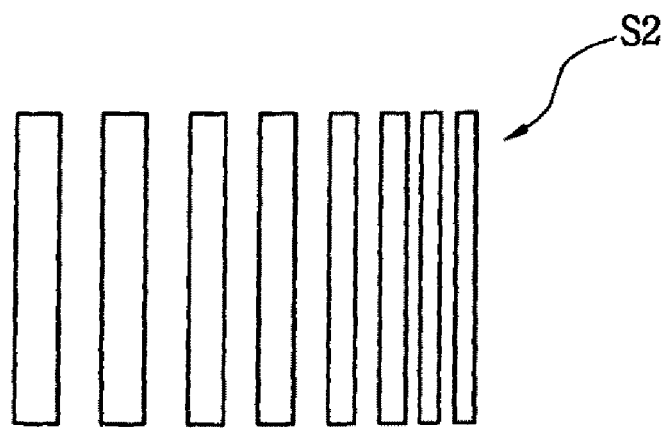
Figure 2C:
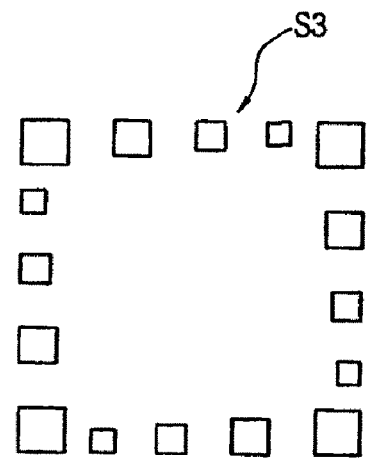
Figure 2D:
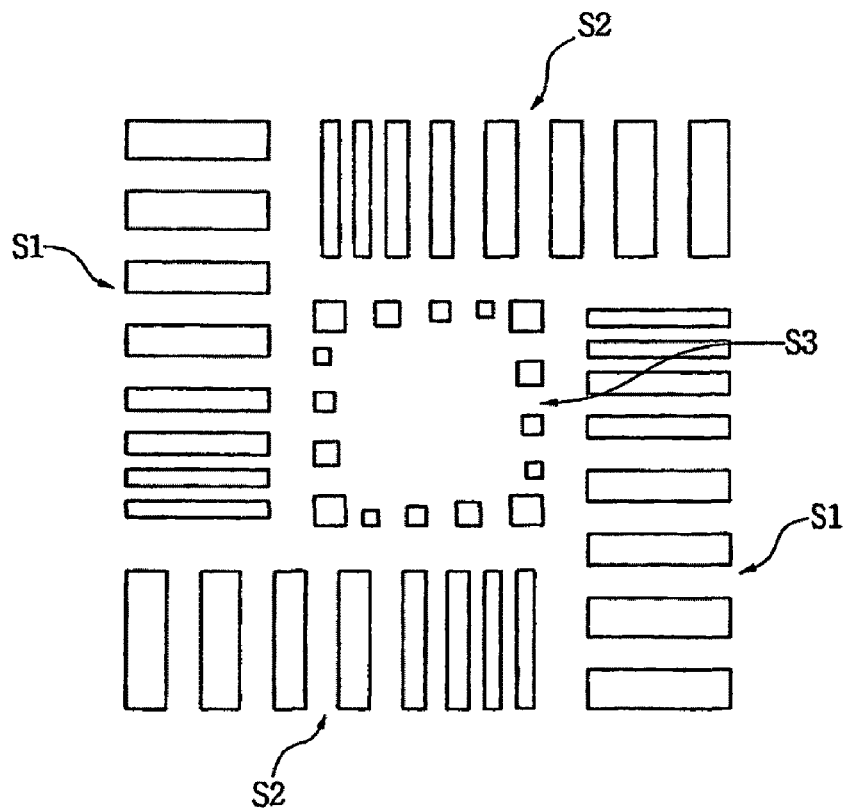

For example, referring to FIG. 2A, first slits S1 may be formed to have linear horizontal shapes, e.g., lines, bars, or windows. The first slits S1 may have uniform widths, e.g., as illustrated with respect to slits S in FIG. 1, or varying widths in upward and downward directions. Although the first slits S1 are shapes of horizontal bars in FIG. 2A, it may be interpreted that horizontal lengths of the first slits S1 may be greater than their vertical lengths. In another example, referring to FIG. 2B, second slits S2 may be formed in linear vertical shapes, e.g., lines, bars, or windows. The second slits S2 may have various widths in leftward and rightward directions. Although the second slits S2 are shapes of vertical bars in FIG. 2B, it may be interpreted that vertical lengths of the second slits S2 may be greater than their horizontal lengths. In yet another example, referring to FIG. 2C, third slits S3 may be formed in shapes of rectangles. However, it may be interpreted that the third slits S3 may be formed in various shapes of horizontal and vertical widths and lengths. In still another example, referring to FIG. 2D, various combinations of first, second and third slits S1, S2, and S3 may be formed on a same photomask. The first to third slits S1 to S3 may be properly selected according to NAs of illumination systems and/or CDs of patterns to be formed on wafers. Further, the first to third slits S1 to S3 may be pairs of one another.

Figure 3A:
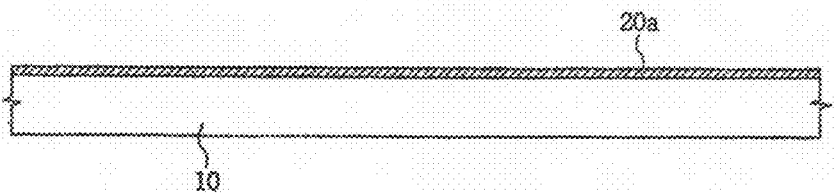
FIGS. 3A to 3E illustrate conceptual cross-sectional views of a method of fabricating a reflective photomask according to example embodiments.

FIGS. 3A to 3E illustrate cross-sectional views of stages in a method of fabricating a reflective photomask according to example embodiments. Referring to FIG. 3A, a phase shift layer 20a may be formed on the substrate 10. The phase shift layer 20a may be formed of, e.g., chromium, using physical deposition methods, e.g., a sputtering process.

Figure 3B:
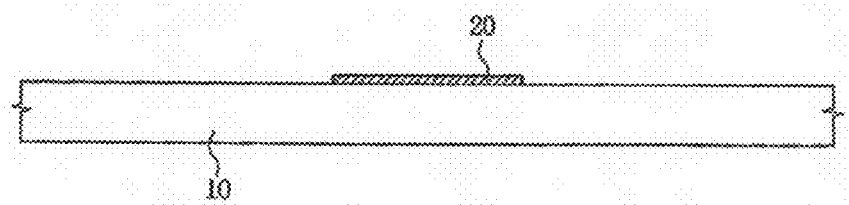

Referring to FIG. 3B, the phase shift object 20 may be formed, e.g., by a lithography process. The lithography process may be one of processes using optical light or an electron beam. For example, first, an electron beam resist layer may be entirely formed on the phase shift layer 20a. Second, virtual images of the phase shift object 20 may be drawn to the electron beam resist using an electron beam. Third, electron beam resist patterns exposing surfaces of the phase shift layer 20a may be formed by a developing process. Fourth, the phase shift object 20 may be formed by a patterning process that selectively removes the exposed portions of the phase shift layer 20a by the electron beam resist patterns as a patterning mask. Fifth, the electron beam resist patterns may be removed.

Figure 3C:
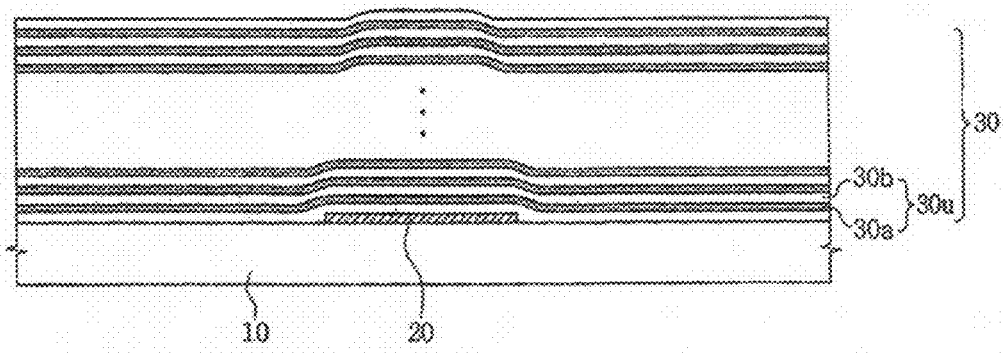

Referring to FIG. 3C, the reflective layer 30 may be entirely formed on the substrate 10 having the phase shift object 20 thereon. The reflective layer 30 may include alternating first and second reflective layers 30a and 30b, e.g., formed by an atomic layer deposition method. For example, the first reflective layer 30a may be formed of molybdenum, and the second reflective layer 30b may be formed of silicon. A pair including one layer of the first reflective layer 30a and one layer of the second reflective layer 30b may define the unit reflective layer 30u. The unit reflective layer 30u may have a thickness of about 6.7 nm to about 6.8 nm, i.e., an equivalent of about ½ of a wavelength of a main light used in the illumination system. The reflective layer 30 may be formed by stacking about forty (40) pairs of the unit reflective layer 30u. The reflective layer 30 may have at least one bend portion 30bd shaped by the phase shift object 20.

Figure 3D:
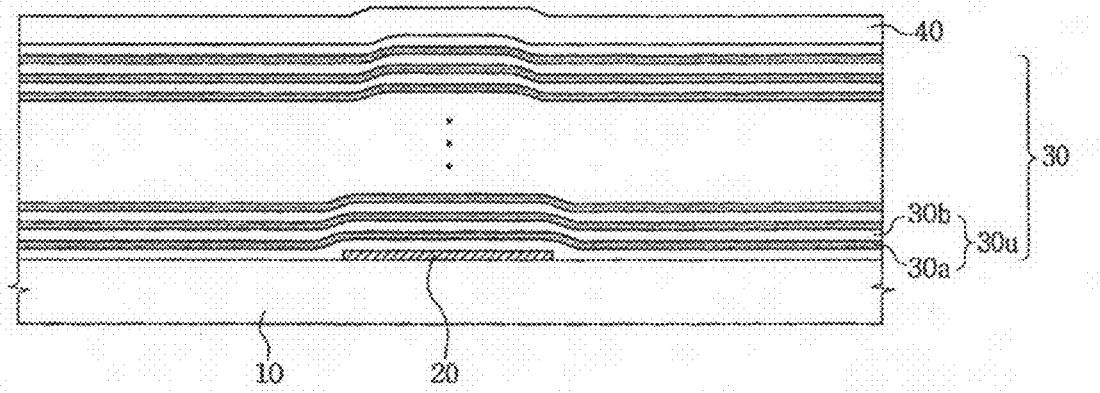

Referring to FIG. 3D, the capping layer 40 may be formed on the reflective layer 30. The capping layer 40 may be formed of silicon oxide, e.g., using a high density plasma deposition method. The capping layer 40 may have at least one bend portion 40bd shaped by the phase shift object 20, e.g., the bend portion 40bd of the capping layer 40 may correspond to and completely overlap the bend portion 30bd of the reflective layer 30.

Figure 3E:
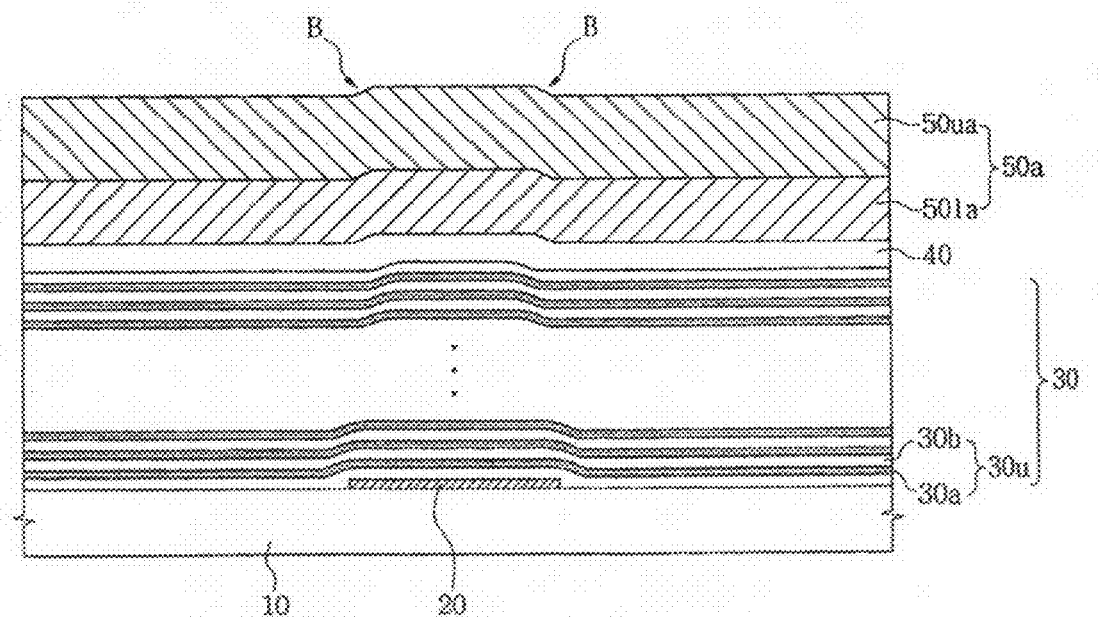

Referring to FIG. 3E, the light absorption layer 50a may be formed on the capping layer 40. The light absorption layer 50a may include the lower light absorption layer 50la and the upper light absorption layer 50ua. The lower light absorption layer may be formed of a refractory metal, e.g., ruthenium, of about 50 nm thickness, and the upper light absorption layer 50ua may be formed of, e.g., chromium or tantalum nitride, to a thickness of about 70 nm. As the reflective layer 30 and the capping layer 40 include bend portions over edges of the phase shift object 20 due to height differences between the phase shift object 20 and the substrate 10, the light absorption layer 50a may include corresponding bend portions B, as illustrated in FIG. 3E. Successively, the light absorption pattern 50 and the slits S, e.g., one or more of the first through third slits S1-S3 in FIGS. 2A-2D, may be formed by a patterning process patterning the bend portions B of the light absorption layer 50a. In other words, the light absorption layer 50a may be patterned in the bend portions B, e.g., portions of the light absorption layer 50a including the bend portions B may be removed to define trenches through the light absorption layer 50a, to expose the bend portions 40bd of the capping layer 40. Therefore, the slits S, i.e., the trenches formed in the light absorption layer 50a, may expose the bend portions 40bd of the capping layer 40, as illustrated in FIG. 1.

Figure 4:
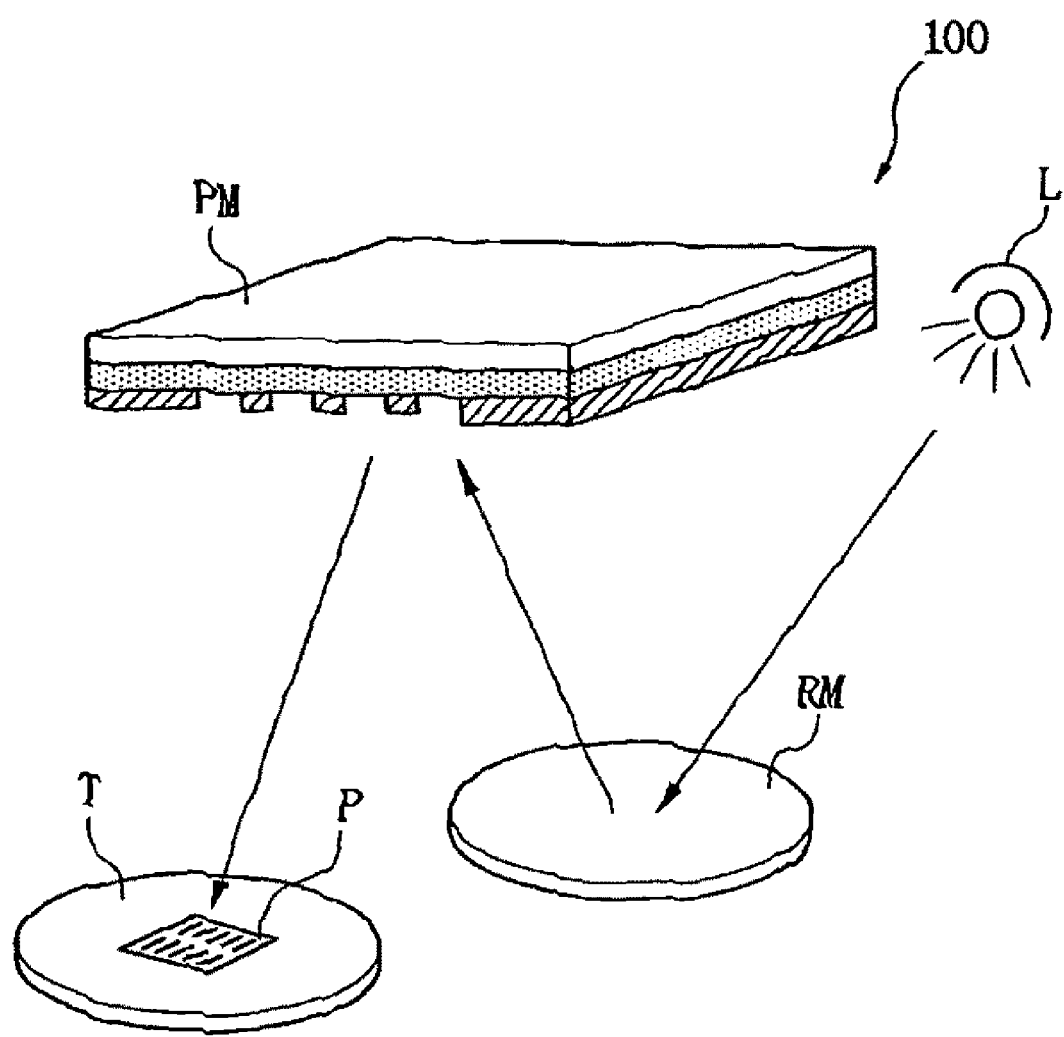
FIG. 4 illustrates a conceptual perspective view of a reflective illumination process using a reflective photomask according to example embodiments.

FIG. 4 illustrates a conceptual plan view of a reflective illumination process using a reflective photomask according to example embodiments. The reflective illumination process may be a monitoring process for monitoring a pattern shift caused by a focus change in a portion of the light. As illustrated in FIG. 4, in a reflective illumination system 100 according to example embodiments, a light source L may generate light, i.e., EUV light, to be incident on a reflective mirror RM, to reflect from the mirror RM to be incident on a reflective photomask PM, and to reflect from the reflective photomask PM to be incident on a target T. The reflective photomask PM may be the reflective photomask discussed previously with reference to FIG. 1. The light incident on the target T may form pattern images P on the target T.

The focus of the light L may be shifted or changed. For example, the reflective illumination process may include forming a plurality of the pattern images P with changing focus portions of the light. The target T may be a wafer or a surface for inspecting images of an image inspection apparatus. The pattern images P on the target T may be compared with ideal images by an optical microscope or an electron microscope, e.g., a scanning electron microscope (SEM). The pattern images P on the target T may have various shapes. The pattern shift may be inspected by selecting proper pattern images on the target T.

Figure 5:
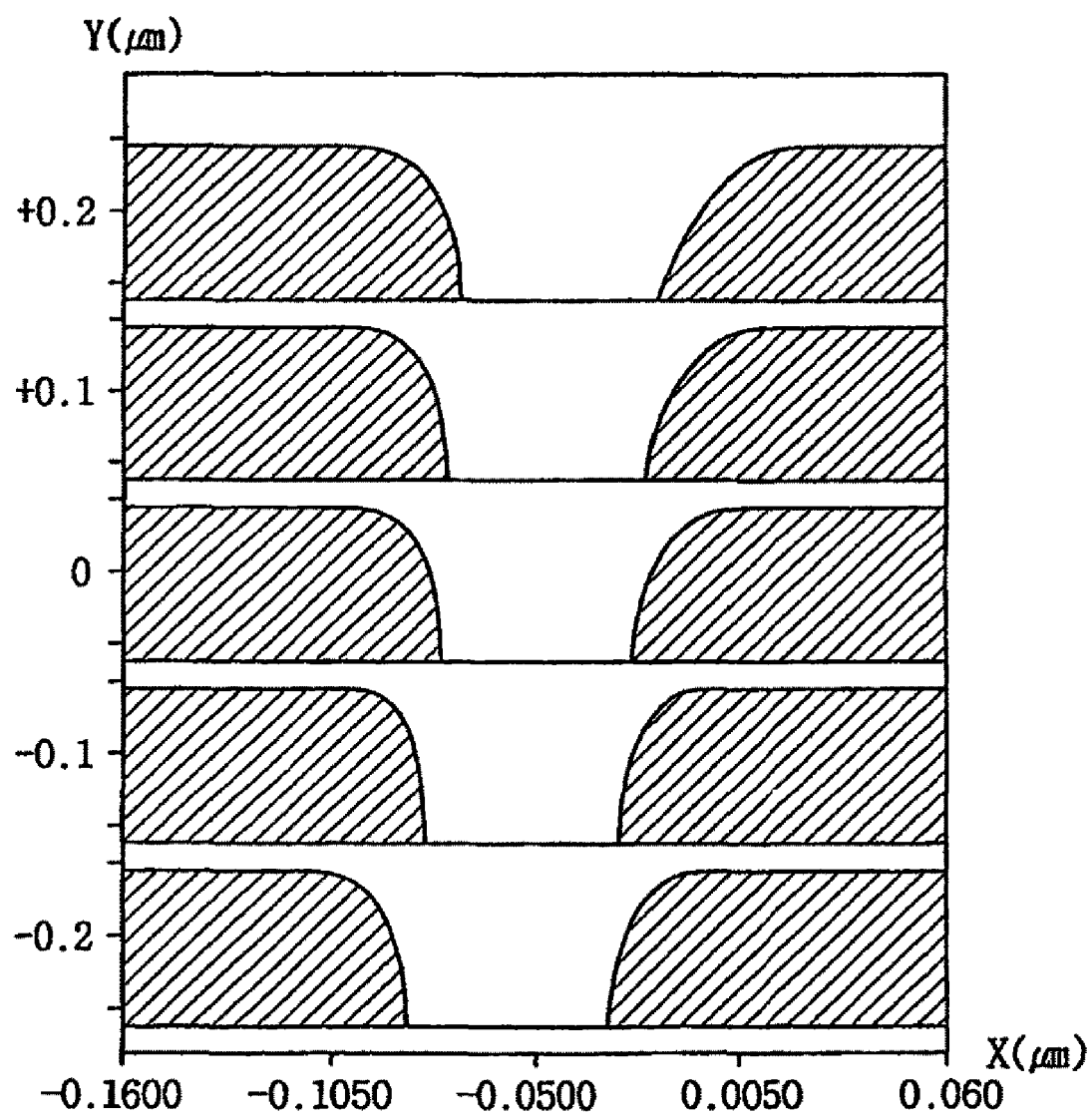
FIG. 5 illustrates a graph of measured pattern shifts caused by changes of the focus of light using a reflective photomask according to example embodiments.

FIG. 5 illustrates a graph obtained by measuring pattern shifts caused by changes of the focus of light using a reflective photomask according to example embodiments. The graph illustrates a monitoring result of pattern shifts caused by changes in position of the focus of light measured through any one slit.

The reflective photomask used for obtaining the measurements has a phase shift object in the shape of a bar with a thickness of about 3.38 nm and a width of about 2 µm. The phase shift object is formed on a glass substrate having a thickness of ¼ inches and an area of 6 square inches. A reflective layer including forty pairs of alternating molybdenum and silicon layers is stacked on the substrate having the phase shift object. Each of the molybdenum layers is formed of about 11 atomic layers and has a thickness of about 2.7 nm, and each of the silicon layers is formed of about 15 atomic layers and has a thickness of about 4.1 nm. The capping layer is formed of silicon oxide ($SiO_2$) to a thickness of 10 nm. A light absorption layer is formed of a ruthenium layer with a thickness of 50 nm on the capping layer and a chromium layer with a thickness of 70 nm on the ruthenium layer. The light absorption layer is patterned to have a central light absorption pattern with a width of 1 µm and slits with a width of about 320 nm.

Referring to FIG. 5, the x-axis of the graph represents a pattern shift distance, and the y-axis represents a position of the focus. Referring to the graph, when the position of the focus varies in the up-down direction, i.e., along the y-axis, the pattern image is shifted along the horizontal direction i.e., along the x-axis. Specifically, when the position of the focus varies from zero (0) to about 2 µm upward or downward, the pattern is shifted to the right or left by about 7 nm. The NA of an illumination system used in this experiment is about 0.3 NA. According to the experiment result, when the position of the focus of light varies by about 2 µm, the position of the pattern is shifted by about 7 nm. If the pattern shift is monitored using two slits, sensitivity is doubled. Therefore, when the position of the focus of light varies by about 1 µm, the pattern will be shifted by about 7 nm. The optimum position of the focus of light may be estimated from the above monitoring result. However, this experiment result is only an example, and thus it is reasonably expected that the pattern shift caused by the change of the focus of light can be more accurately monitored using various light absorption patterns and slits.

A reflective photomask for monitoring according to example embodiments described above may more accurately monitor the pattern shift caused by a change of the focus of light in photolithography equipment using EUV light. Therefore, the photolithography equipment may perform a semiconductor fabrication process in an optimum state, may more accurately form patterns, and may improve productivity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A reflective photomask, comprising:
   a phase shift object on a substrate;
   a reflective layer stacked on the substrate and the phase shift object;
   a capping layer on the reflective layer, the capping layer including at least one surface portion having a bent shape; and
   a light absorption pattern on the capping layer, the light absorption pattern including at least one slit exposing the surface portion of the capping layer having the bent shape.

2. The reflective photomask as claimed in claim 1, wherein the substrate includes glass or silica doped with titanium.

3. The reflective photomask as claimed in claim 1, wherein the phase shift object has a shape of a bar or a rectangle in plan view and a shape of a rectangle in vertical cross-sectional view.

4. The reflective photomask as claimed in claim 3, wherein the phase shift object has a thickness of ½ of a wavelength of light incident on the reflective photomask or less.

5. The reflective photomask as claimed in claim 1, wherein:
   the reflective layer includes a stack of forty pairs of a first reflective layer and a second reflective layer, and
   the phase shift object includes chromium, the first reflective layer is a molybdenum layer, the second reflective layer is a silicon layer, and the capping layer is a silicon oxide layer.

6. The reflective photomask as claimed in claim 1, wherein the light absorption pattern includes a lower light absorption pattern and an upper light absorption pattern, the lower light absorption pattern includes a refractory metal, and the upper light absorption pattern includes chromium or tantalum nitride.

7. The reflective photomask as claimed in claim 1, wherein a bottom of the slit overlaps an edge of the phase shift object.

8. The reflective photomask as claimed in claim 1, wherein a bottom of the slit faces an interior of the slit and is defined by an upper surface of the capping layer, the bottom of the slit being non-flat.

9. The reflective photomask as claimed in claim 1, wherein the bent shape of the capping layer includes two portions arranged at an oblique angle, the slit exposing the oblique angle.

10. The reflective photomask as claimed in claim 1,
    wherein the phase shift object has a mesa shape;
    wherein the reflective layer has at least one bending portion along the mesa shape of the phase shift object;
    wherein the capping layer has at least one bending portion along the bending portion of the reflective layer; and
    wherein the light absorption pattern includes at least one slit exposing at least a portion of the bending portion of the capping layer.

11. A method of fabricating a reflective photomask, comprising,
    forming a phase shift object on a substrate;
    forming a reflective layer on the substrate and the phase shift object;
    forming a capping layer on the reflective layer, the capping layer including at least one surface portion having a bent shape; and
    forming a light absorption pattern on the capping layer, the light absorption pattern including at least one slit exposing the surface portion of the capping layer having the bent shape.

12. The method as claimed in claim 11, wherein forming the phase shift object includes forming a phase shift layer with a thickness of about 6.75 nm on the substrate and patterning the phase shift layer to form the phase shift object.

13. The method as claimed in claim 12, wherein patterning the phase shift layer includes using an electron beam lithography technique.

14. The method as claimed in claim 11, wherein forming the reflective layer includes stacking forty unit reflective layers, one unit reflective layer including a first reflective layer formed of molybdenum and a second reflective layer formed of silicon.

15. The method as claimed in claim 11, wherein forming the light absorption pattern includes forming a light absorption layer to cover the entire capping layer, and patterning the light absorption layer in regions overlapping the bent shape of the capping layer to form at least one slit.

16. A method of performing a reflective illuminating process, comprising:

generating light from a light source;

directing the light from the light source to be incident on a mirror, such that the light is reflected from the mirror to be incident on the reflective photomask of claim 1; and directing the light from the reflective photomask to be incident on a target to form a pattern image.

17. The method as claimed in claim 16, further comprising repeatedly illuminating the reflected light from the reflected photomask on the target plan to form pattern images, the reflected light having shifted focus portions.

18. The method as claimed in claim 16, further comprising inspecting the pattern image using an optical microscope or an electron microscope.

19. The method as claimed in claim 16, wherein the target is an inspection plan of pattern inspection apparatus.

* * * * *